(12) United States Patent
Ko et al.

(10) Patent No.: US 8,304,666 B2
(45) Date of Patent: Nov. 6, 2012

(54) STRUCTURE OF MULTIPLE COAXIAL LEADS WITHIN SINGLE VIA IN SUBSTRATE AND MANUFACTURING METHOD THEREOF

(75) Inventors: Cheng-Ta Ko, Hsinchu (TW); Min-Lin Lee, Hsinchu (TW); Wei-Chung Lo, Taipei County (TW); Shur-Fen Liu, Hsinchu County (TW); Jinn-Shing King, Hsinchu (TW); Shinn-Juh Lai, Hsinchu County (TW); Yu-Hua Chen, Nantou County (TW)

(73) Assignee: Industrial Technology Research Institute, Hsinchu (TW)

( * ) Notice: Subject to any disclaimer, the term of this patent is extended or adjusted under 35 U.S.C. 154(b) by 458 days.

(21) Appl. No.: 12/468,058

(22) Filed: May 19, 2009

(65) Prior Publication Data

US 2010/0163296 A1 Jul. 1, 2010

(30) Foreign Application Priority Data

Dec. 31, 2008 (TW) .............................. 97151842 A

(51) Int. Cl.
*H05K 1/11* (2006.01)
(52) U.S. Cl. ........ 174/262; 174/266; 391/792; 391/793; 391/794; 391/795
(58) Field of Classification Search .......... 174/261–266; 361/792–795; 216/13; 29/852
See application file for complete search history.

(56) References Cited

U.S. PATENT DOCUMENTS

| | | | | |
|---|---|---|---|---|
| 5,421,083 A * | 6/1995 | Suppelsa et al. | ................ | 29/852 |
| 5,541,567 A * | 7/1996 | Fogel et al. | ................... | 336/200 |
| 5,587,119 A | 12/1996 | White | | |
| 5,828,555 A * | 10/1998 | Itoh | .............................. | 361/784 |
| 5,949,030 A * | 9/1999 | Fasano et al. | ................ | 174/262 |
| 6,388,208 B1 * | 5/2002 | Kiani et al. | .................... | 174/266 |
| 6,479,764 B1 * | 11/2002 | Frana et al. | ................... | 174/262 |
| 6,717,071 B2 * | 4/2004 | Chang et al. | ................... | 174/266 |
| 6,943,452 B2 * | 9/2005 | Bertin et al. | .................. | 257/774 |
| 7,129,567 B2 * | 10/2006 | Kirby et al. | .................. | 257/621 |
| 7,404,250 B2 | 7/2008 | Cheng et al. | | |
| 2002/0017399 A1* | 2/2002 | Chang et al. | ................. | 174/262 |

(Continued)

FOREIGN PATENT DOCUMENTS

TW 525417 3/2003

(Continued)

OTHER PUBLICATIONS

"Office Action of Taiwan Counterpart Application", issued on Jun. 28, 2012, p. 1-p. 9.

*Primary Examiner* — Timothy Thompson
*Assistant Examiner* — Sherman Ng
(74) *Attorney, Agent, or Firm* — Jianq Chyun IP Office

(57) ABSTRACT

A plurality of coaxial leads is made within a single via in a circuit substrate to enhance the density of vertical interconnection so as to match the demand for higher density multi-layers circuit interconnection between top circuit layer and bottom circuit layer of the substrate. Coaxial leads provide electromagnetic interference shielding among the plurality of coaxial leads in a single via.

21 Claims, 13 Drawing Sheets

U.S. PATENT DOCUMENTS

| | | | |
|---|---|---|---|
| 2002/0179332 A1* | 12/2002 | Uematsu et al. | 174/262 |
| 2003/0168250 A1* | 9/2003 | Pasternak et al. | 174/256 |
| 2005/0178585 A1* | 8/2005 | Kim et al. | 174/262 |
| 2005/0247482 A1* | 11/2005 | Nakamura | 174/262 |
| 2006/0043598 A1* | 3/2006 | Kirby et al. | 257/774 |
| 2006/0214010 A1* | 9/2006 | Chan et al. | 235/492 |
| 2007/0124930 A1* | 6/2007 | Cheng et al. | 29/852 |
| 2007/0194431 A1* | 8/2007 | Corisis et al. | 257/698 |
| 2007/0230150 A1* | 10/2007 | Castriotta et al. | 361/794 |

FOREIGN PATENT DOCUMENTS

| | | |
|---|---|---|
| TW | I248330 | 1/2006 |

\* cited by examiner

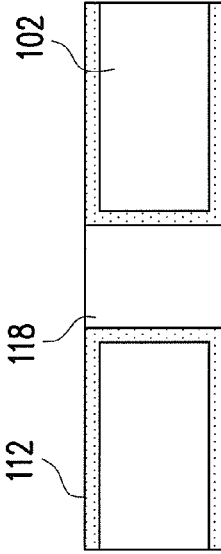
FIG. 1D (PRIOR ART)
FIG. 1E (PRIOR ART)
FIG. 1F (PRIOR ART)
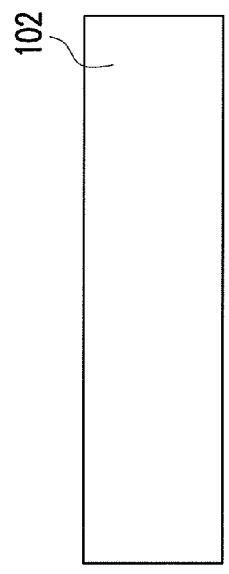
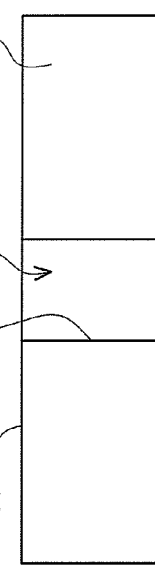
FIG. 1A (PRIOR ART)
FIG. 1B (PRIOR ART)
FIG. 1C (PRIOR ART)

FIG. 5A
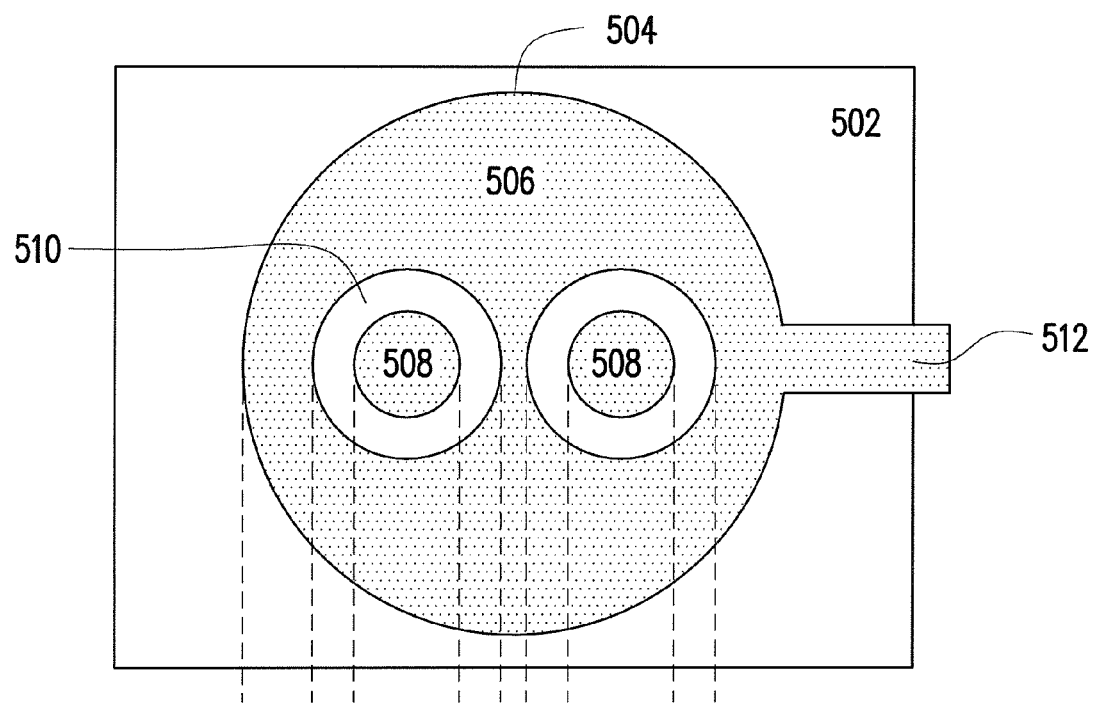
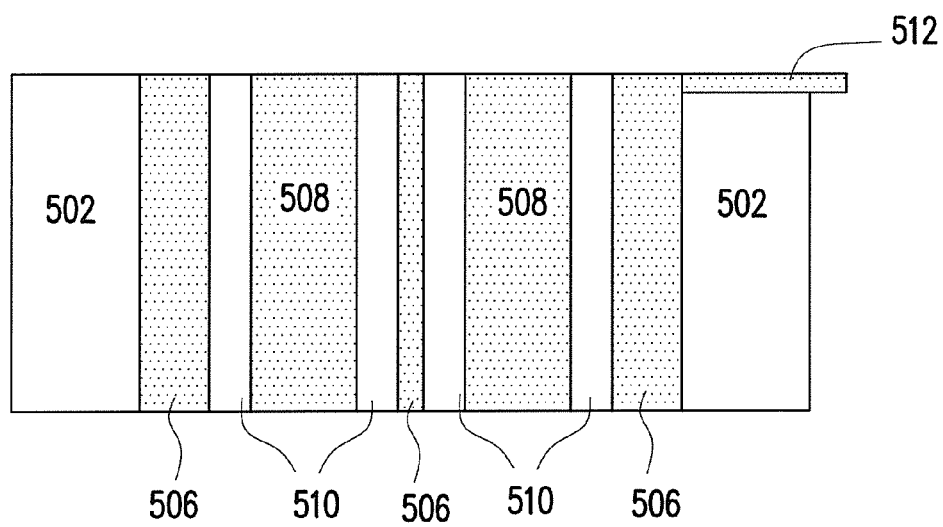
FIG. 5B

STRUCTURE OF MULTIPLE COAXIAL LEADS WITHIN SINGLE VIA IN SUBSTRATE AND MANUFACTURING METHOD THEREOF

CROSS-REFERENCE TO RELATED APPLICATION

This application claims the priority benefit of Taiwan application serial no. 97151842, filed on Dec. 31, 2008. The entirety of the above-mentioned patent application is hereby incorporated by reference herein and made a part of specification.

BACKGROUND

1. Technical Field

The present disclosure relates to a structure of leads within a via in a substrate, and more particularly to a structure of multiple coaxial leads within a single via in a substrate.

2. Description of Related Art

As the manufacturing process of semiconductors becomes more and more precise, in the future manufacturing process below 45 nm, the problem of severe impedance mismatch inevitably occurs when it intends to guide an ultra-thin lead with a width lower than 45 nm to pass through a via with an aperture larger than 1 μm and connect the ultra-thin lead to another ultra-thin lead, and thereby, it fails to achieve a high-speed signal transmission. However, if a plurality of leads is disposed in the via to solve the above problem, the problem of crosstalk among the plurality of leads turns to occur.

For example, U.S. Pat. No. 5,587,119 discloses a coaxial lead structure. FIGS. 1A to 1F are schematic cross-sectional views of a coaxial lead structure manufactured by a method provided in U.S. Pat. No. 5,587,119. First, referring to FIG. 1A, a substrate 102 is provided. Then, a first via 104 is disposed in the substrate 102, the substrate 102 has an upper surface 106 and a lower surface 108, and the first via 104 has a via wall surface 110, as shown in FIG. 1B. Next, referring to FIG. 1C, a surface metal layer 112 and a via wall metal layer 114 are formed, and then a second via 116 with the via wall metal layer 114 is obtained. Afterward, an insulating material 118 is filled in the second via 116, as shown in FIG. 1D. Then, as shown in FIG. 1E, a third via 120 is disposed in a center of the insulating material 118. Finally, as shown in FIG. 1F, metal leads 122 are filled in the third via 120, so that the via wall metal layer 114, the insulating material 118, and the central metal leads 122 constitute the coaxial lead structure 100. In the coaxial lead structure 100, the via wall metal layer 114 may be grounded, and as the central metal leads 122 are surrounded thereby, the metal leads 122 are under good electromagnetic shielding, thus eliminating the problem of crosstalk.

U.S. Pat. No. 5,421,083 also discloses a coaxial lead structure. FIG. 2 is a schematic cross-sectional view of a coaxial lead structure manufactured by a method provided in U.S. Pat. No. 5,421,083. The coaxial lead structure 200 includes a substrate 202, a first conductive layer 204, a second conductive layer 206, a first insulating layer 208, and a second insulating layer 210. In this patent, both the first conductive layer 204 and the second conductive layer 206 pass through a via simultaneously to transmit signals.

U.S. Pat. No. 6,943,452 further discloses a coaxial lead structure. FIG. 3 is a schematic cross-sectional view of a coaxial lead structure provided in U.S. Pat. No. 6,943,452. The coaxial lead structure 300 includes a cylindrical lead 304 capable of being placed in a conductive tube 306 and electrically connected to the conductive tube 306. The conductive tube 306 is disposed in a composite substrate 302, and surrounded by a plurality of grounding devices 308. However, the grounding devices 308 are not continuous from top to bottom.

U.S. Pat. No. 7,404,250 further discloses a coaxial lead structure. FIG. 4 is a schematic cross-sectional view of a coaxial lead structure provided in U.S. Pat. No. 7,404,250. The coaxial lead structure 400 includes a first lead 404, insulating layers 406 surrounding the first lead 404, and second leads 410 and conductive layers 408 surrounding the insulating layers 406. The conductive layers 408 are electrically connected to the first lead 404. Similar to U.S. Pat. No. 5,421,083, this patent provides a solution that both the first lead 404 and the second leads 410 pass through a via simultaneously to transmit signals.

In addition, U.S. Pat. No. 6,943,452 and ROC Patent No. I248330 respectively disclose a lead structure including a grounding device, so as to reduce the crosstalk among the leads. U.S. Pat. No. 7,129,567 discloses a solution of disposing a plurality of leads within a single via.

As the manufacturing process of semiconductors becomes increasingly precise, it is an inevitable trend to manufacture multiple coaxial leads within a single via in the future, which may increase the circuit density in a unit of area, and make the products thinner, lighter, shorter, and smaller. However, seen from the above, the prior art discloses the manufacturing of one coaxial lead in a single via or the manufacturing of a plurality of leads in a single via, and the problem of crosstalk still exists. Therefore, manufacturing a plurality of coaxial leads in a single via while avoiding the problem of crosstalk is needed urgently.

SUMMARY

In an exemplary embodiment, the manufacturing method includes the following steps. First, a first substrate and a second substrate are provided, a first conductive layer is disposed on a surface of the first substrate, and a second conductive layer is disposed on a surface of the second substrate. After that, the first substrate is disposed on the second conductive layer. Next, a via is formed in the first substrate, and a surrounding conductor is disposed in the via. Then, the surrounding conductor is patterned to form a plurality of ring-shaped trenches, and at least one lead is formed in each of the ring-shaped trenches. Finally, an insulating material is filled in the ring-shaped trenches.

The present disclosure is further directed to a structure of multiple coaxial leads within a single via in a substrate. The structure includes a substrate formed with at least one via, and multiple coaxial leads are disposed in the via. Each group of the coaxial leads at least includes a surrounding conductor, an annular insulating material, and a lead.

In order to make the aforementioned and other features of the present disclosure comprehensible, exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate exemplary embodiments and, together with the description, serve to explain the principles of the invention.

FIGS. 1A to 1F are schematic cross-sectional views of a coaxial lead structure manufactured by a method disclosed in U.S. Pat. No. 5,587,119.

FIG. 5A is a schematic top view of a structure of leads within a via in a substrate according to an exemplary embodiment.

FIG. 5B is a schematic cross-sectional view of a structure of leads within a via in a substrate according to an exemplary embodiment.

DETAILED DESCRIPTION

Figure 2:
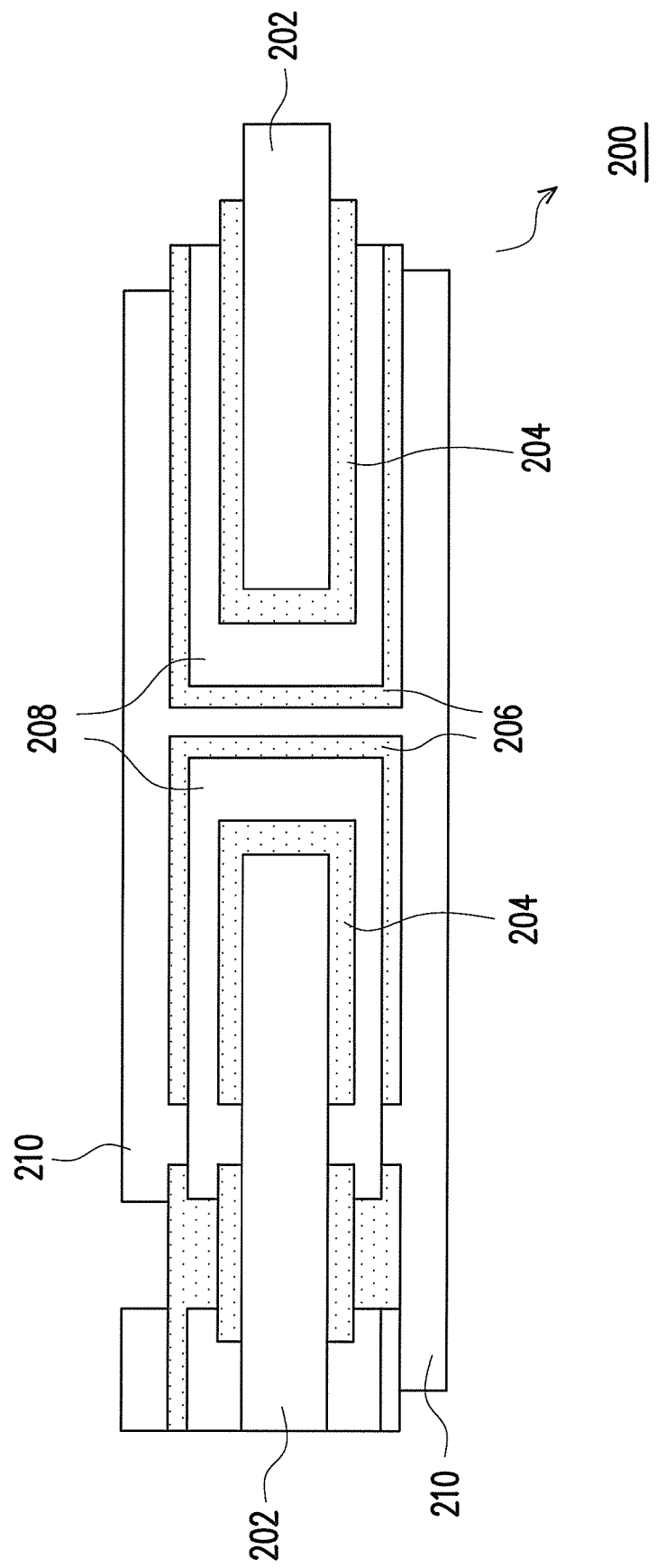
FIG. 2 is a schematic cross-sectional view of a coaxial lead structure manufactured by a method disclosed in U.S. Pat. No. 5,421,083.
Figure 3:
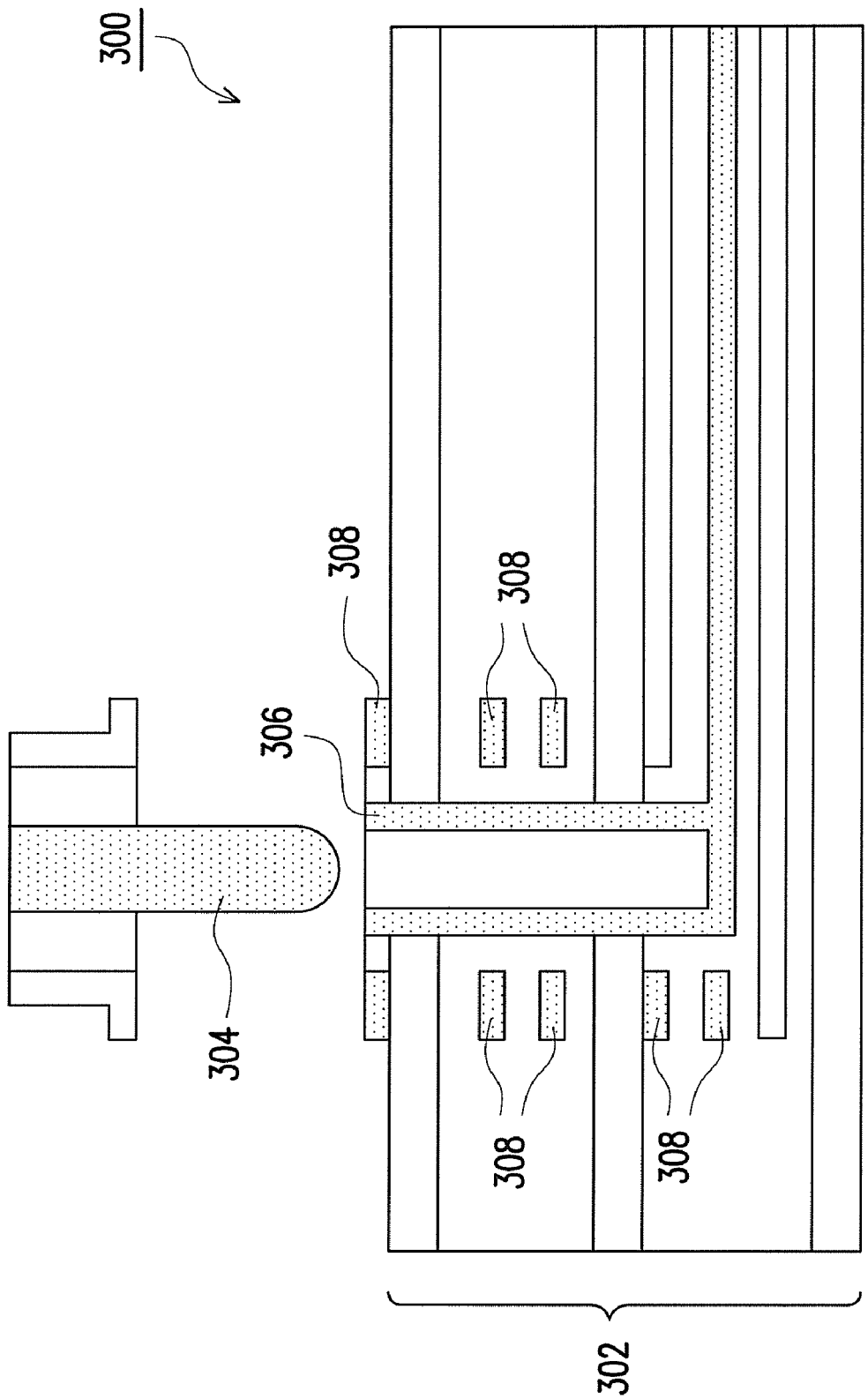
FIG. 3 is a schematic cross-sectional view of a coaxial lead structure disclosed in U.S. Pat. No. 6,943,452.
Figure 4:
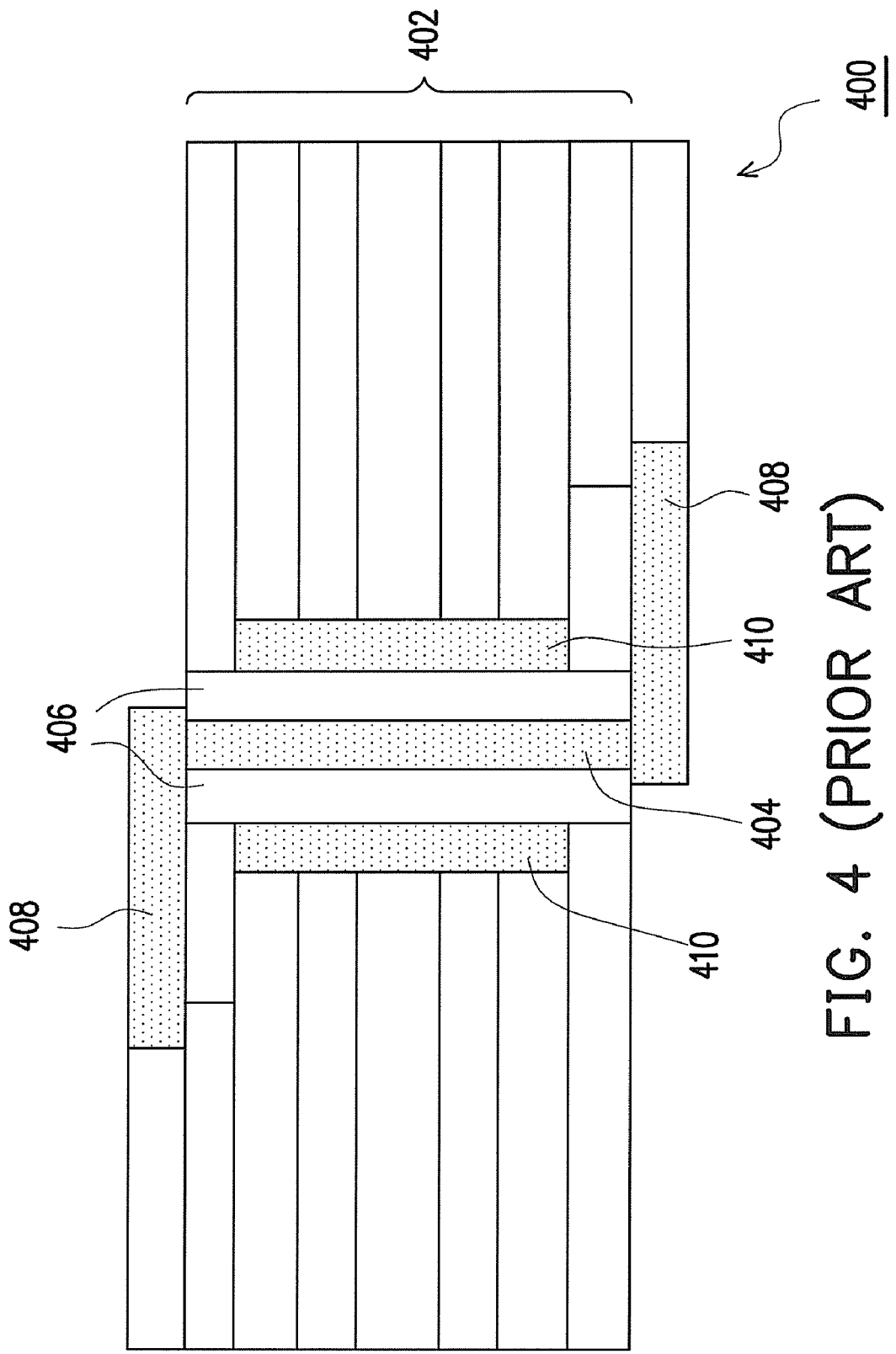
FIG. 4 is a schematic cross-sectional view of a coaxial lead structure disclosed in U.S. Pat. No. 7,404,250.

Reference will now be made in detail to the present exemplary embodiments, examples of which are illustrated in the accompanying drawings. Wherever possible, the same reference numbers are used in the drawings and the description to refer to the same or like parts.

The structure of leads within a via in a substrate and a manufacturing method thereof provided by the present disclosure are described below through different exemplary embodiments.

FIGS. 5A and 5B are respectively a schematic top view and a schematic cross-sectional view of a structure of leads within a via in a substrate according to an exemplary embodiment. A substrate 502 has a via 504. The via 504 includes a surrounding conductor 506 and two leads 508, and the surrounding conductor 506 surrounds the leads 508. An insulating material 510 is disposed between the surrounding conductor 506 and the leads 508 for insulating. Top ends and bottom ends of the leads 508 are exposed, so as to be electrically connected to conductive layers beside the substrate 502. A conductive layer 512 is electrically connected to the surrounding conductor 506, so as to enable the surrounding conductor 506 to be connected to a voltage potential such as a ground potential. As the leads 508 are surrounded by the surrounding conductor 506, the leads 508 are under good electromagnetic shielding.

Figure 6A:
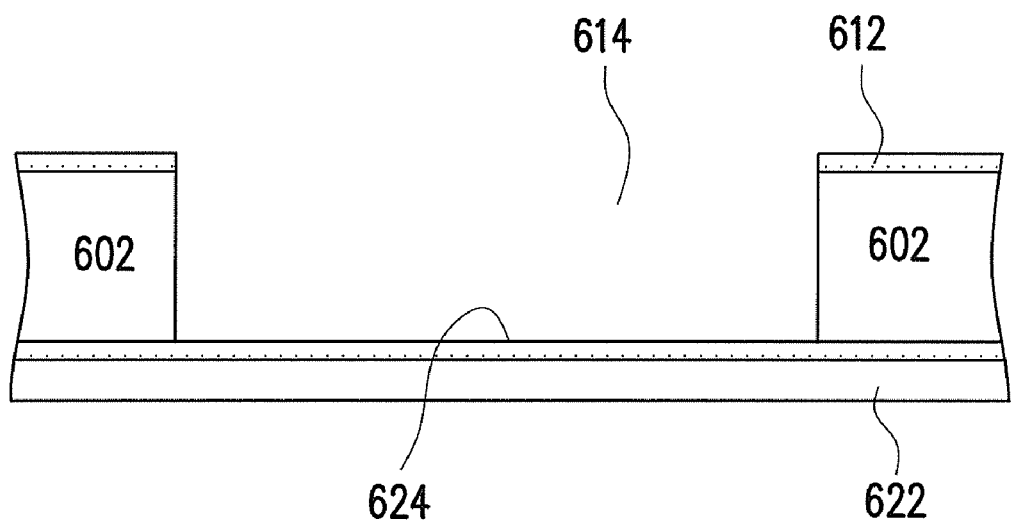
FIGS. 6A to 6L are schematic cross-sectional views of a structure of leads within a via in a substrate manufactured according to an exemplary embodiment.
Figure 6B:
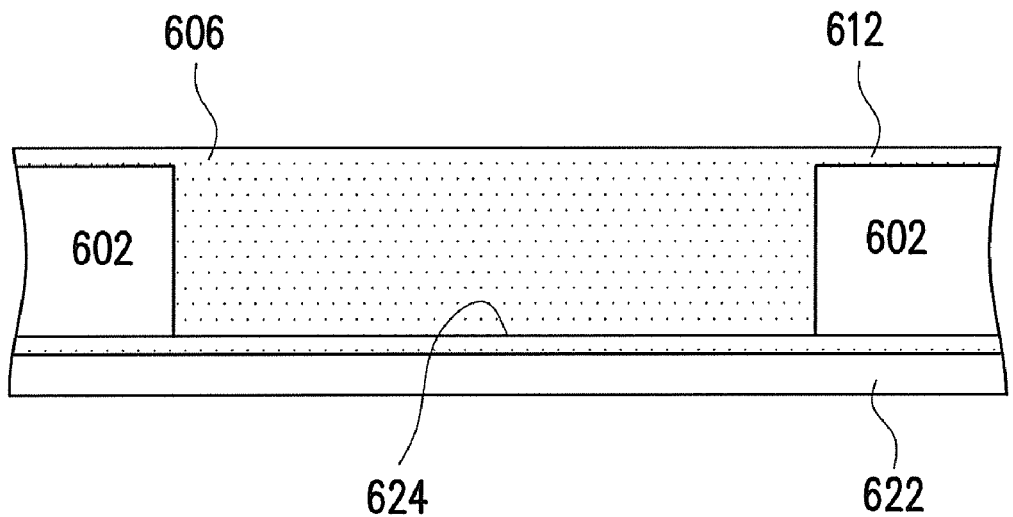
Figure 6C:
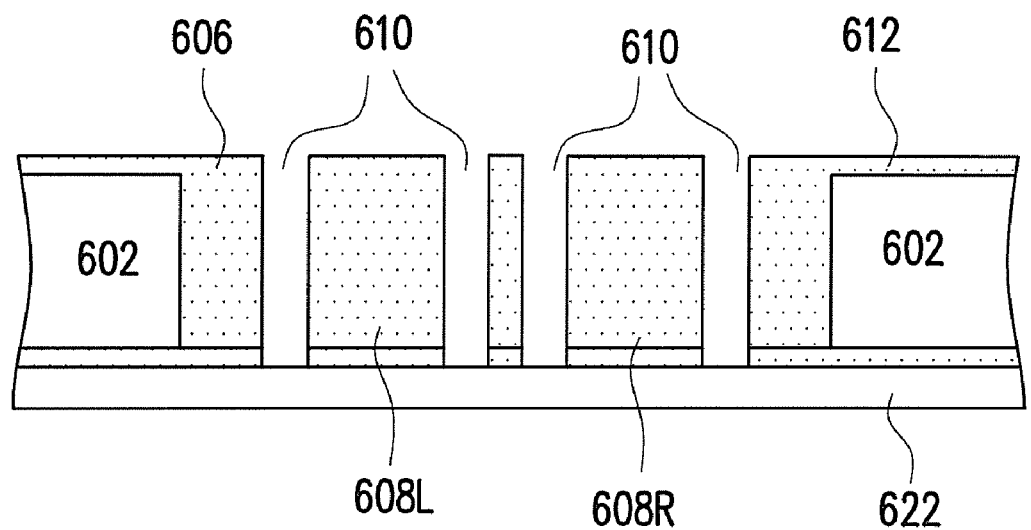
Figure 6D:
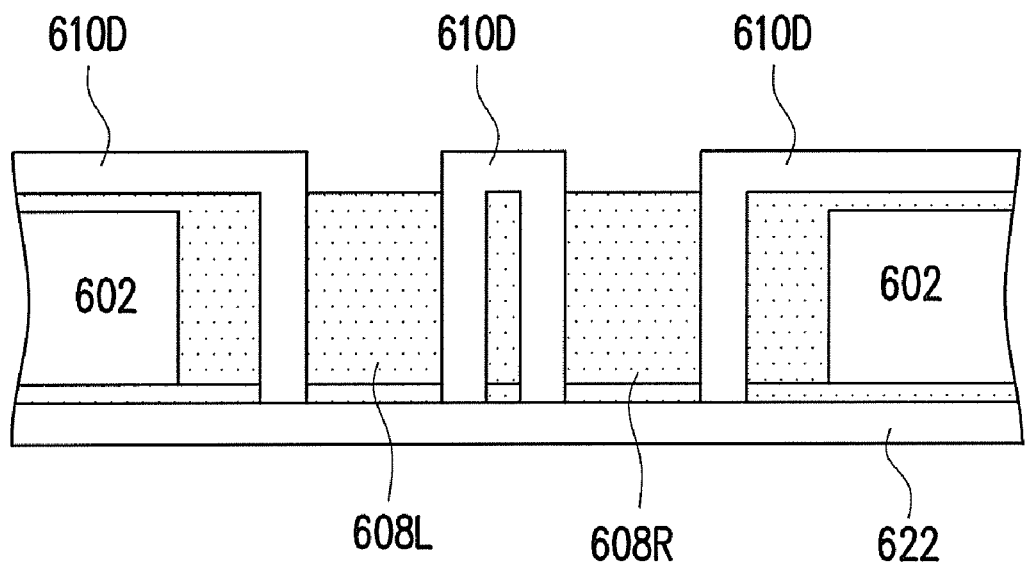
Figure 6E:
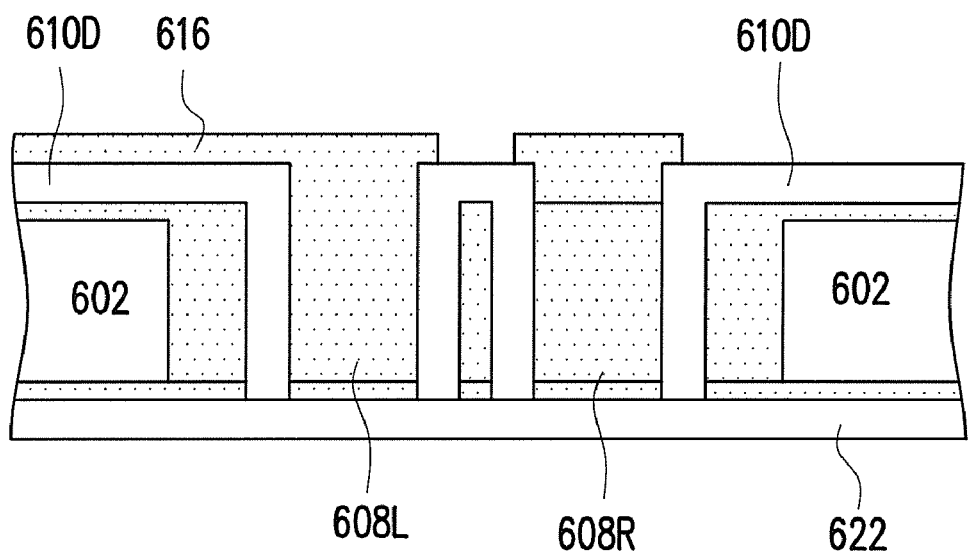
Figure 6F:
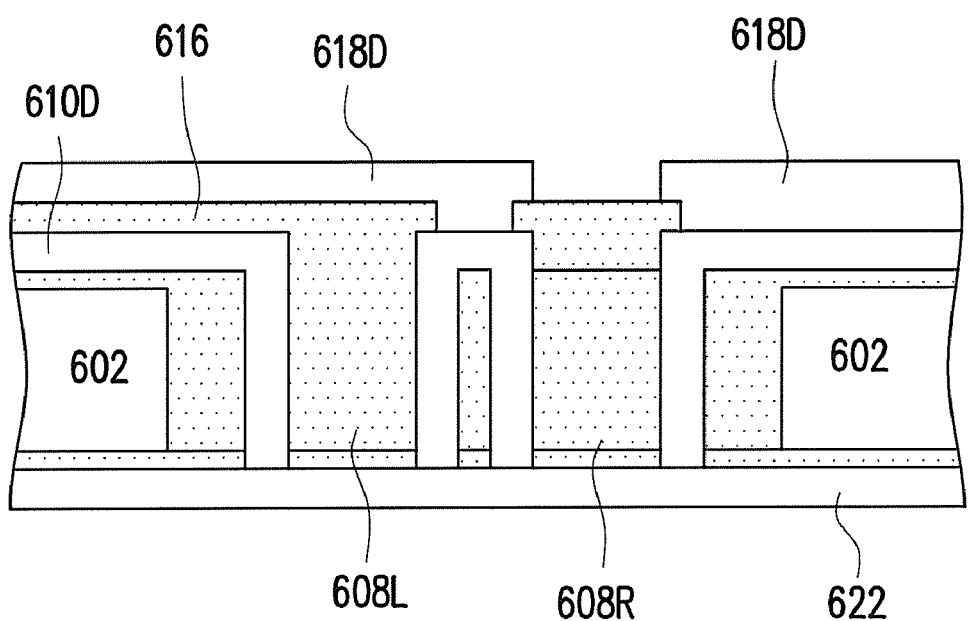
Figure 6G:
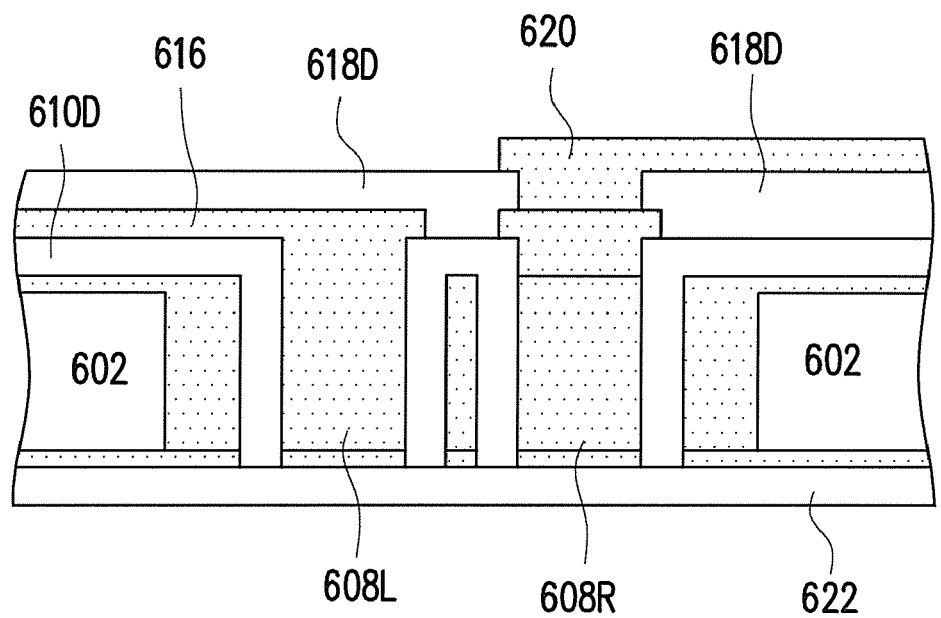

FIGS. 6A to 6L are schematic cross-sectional views of a structure of leads within a via in a substrate manufactured according to an exemplary embodiment. First, as shown in FIG. 6A, a first substrate 602 and a second substrate 622 are provided, a first conductive layer 612 is disposed on a surface of the first substrate 602, and a second conductive layer 624 is disposed on a surface of the second substrate 622. A first via 614 is also formed. The first substrate 602 is disposed on the other surface of the second conductive layer 624. Next, referring to FIG. 6B, a surrounding conductor 606 is disposed to fill the first via 614, and the surrounding conductor 606 is electrically connected to the first conductive layer 612 and the second conductive layer 624. The surrounding conductor 606 and the second conductive layer 624 there-below are patterned to form ring-shaped trenches 610, and the ring-shaped trenches 610 have leads 608L and leads 608R therein (which are originally a portion of the surrounding conductor 606), as shown in FIG. 6C. Afterward, insulating materials 610D are used to fill the ring-shaped trenches 610 and surfaces of the surrounding conductor 606, the first conductive layer 612, the leads 608L, and the leads 608R, and then the insulating materials 610D are patterned to expose the surfaces of the leads 608L and the leads 608R, as shown in FIG. 6D. Next, referring to FIG. 6E, a third conductive layer 616 is disposed and patterned to be electrically connected to the leads 608L. Then, referring to FIG. 6F, an insulating material layer 618D is disposed and patterned to expose the top end of the leads 608R. After that, a fourth conductive layer 620 is disposed and patterned to be electrically connected to the leads 608R, as shown in FIG. 6G.

Figure 6H:
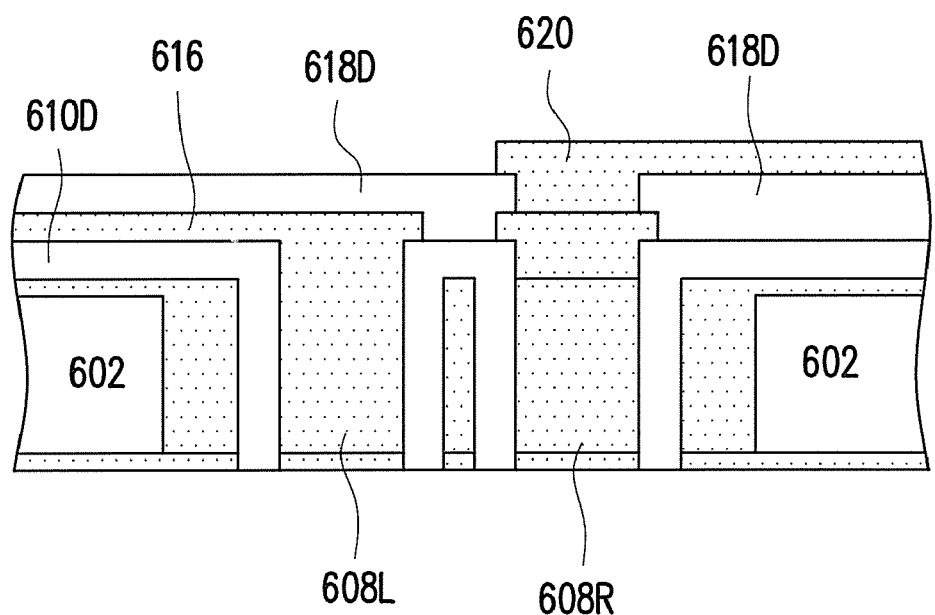
Figure 6I:
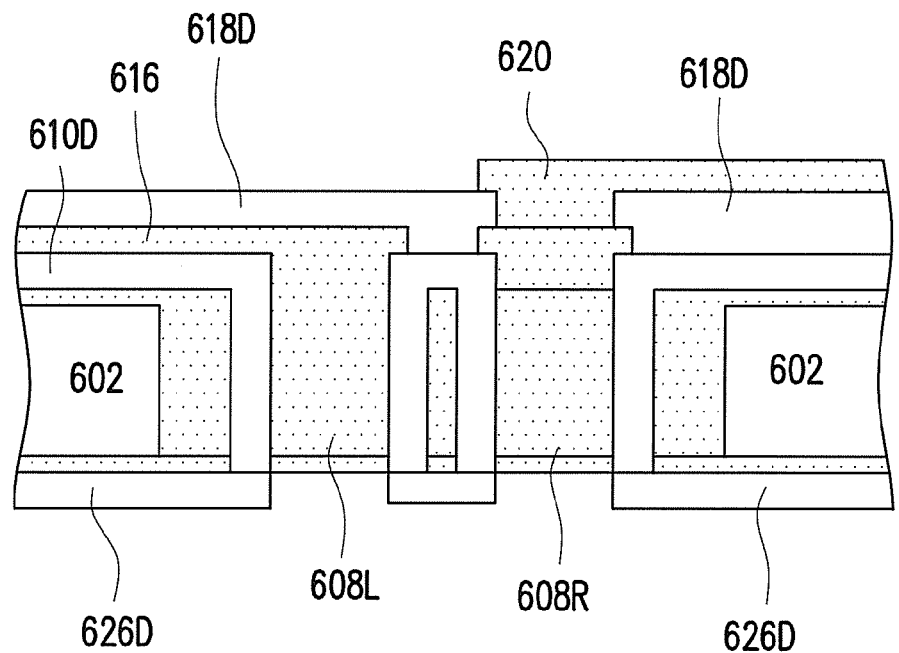
Figure 6J:
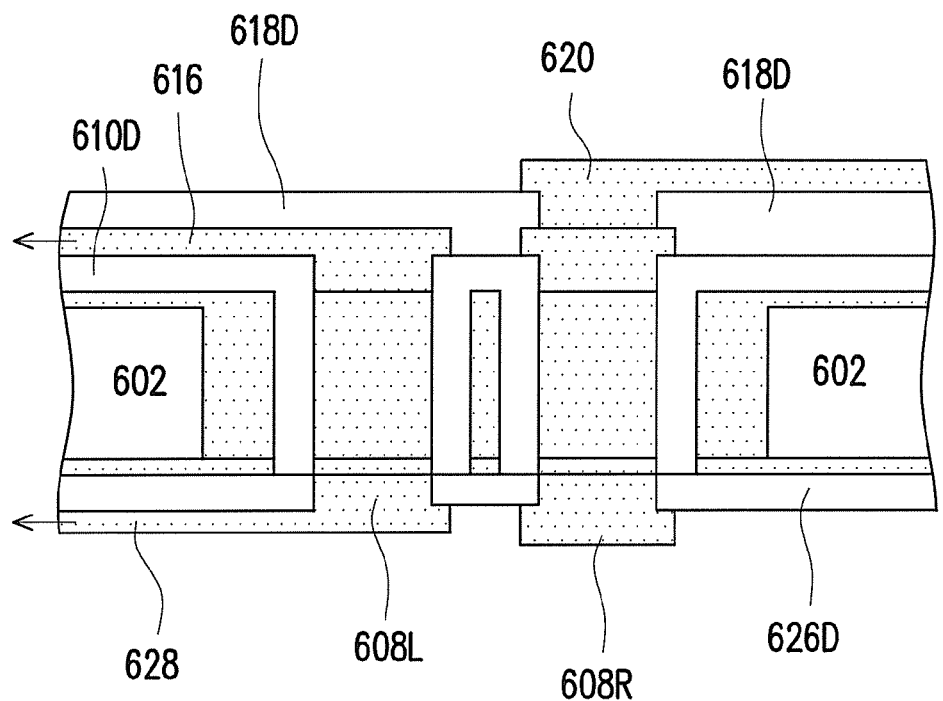
Figure 6K:
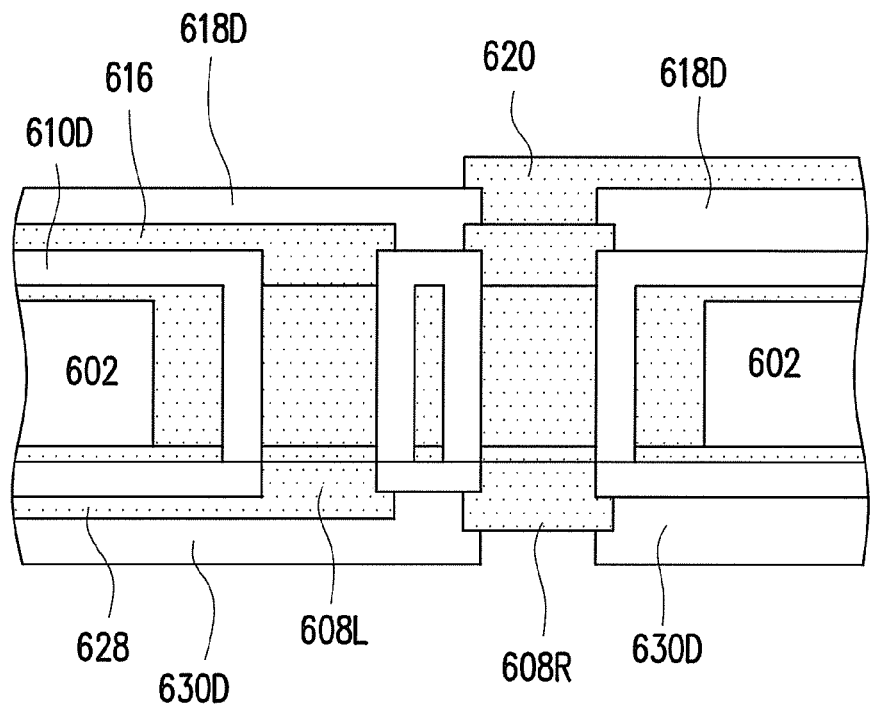
Figure 6L:
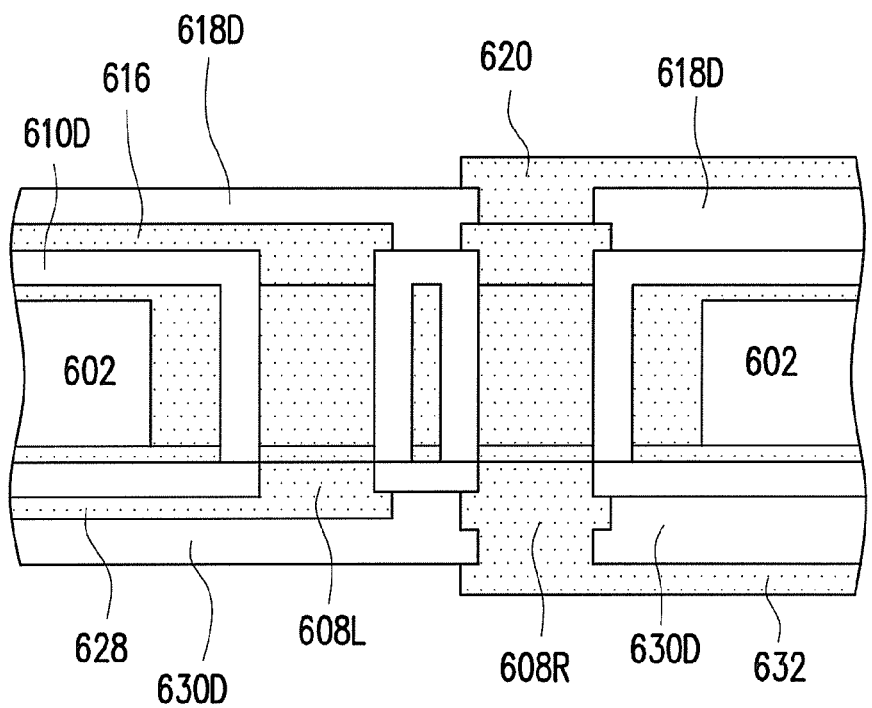

Next, a circuit below the substrate 602 is formed. Referring to FIG. 6H, the second substrate 622 is removed, and an insulating material layer 626D is disposed and patterned to expose the other surfaces of the leads 608L and the leads 608R, as shown in FIG. 6I. Afterward, a fifth conductive layer 628 is disposed and patterned to be electrically connected to the leads 608L, as shown in FIG. 6J. Referring to FIG. 6K, an insulating material layer 630D is disposed and patterned to expose the other surface of the leads 608R. A sixth conductive layer 632 is disposed and patterned to be electrically connected to the leads 608R, as shown in FIG. 6L. In addition, among the above first to sixth conductive layers, the first conductive layer 612 and the second conductive layer 624 enable the surrounding conductor 606 to be electrically coupled to the ground. Further, the third conductive layer 616, the fourth conductive layer 620, the fifth conductive layer 628, and the sixth conductive layer 632 are respectively used to electrically couple the leads 608L and the leads 608R to other signals or potentials.

This exemplary embodiment discloses four signal conductive layers and two ground conductive layers, but the present invention is not limited hereby, and the number of the signal conductive layer and the ground conductive layer may be varied.

Figure 7:
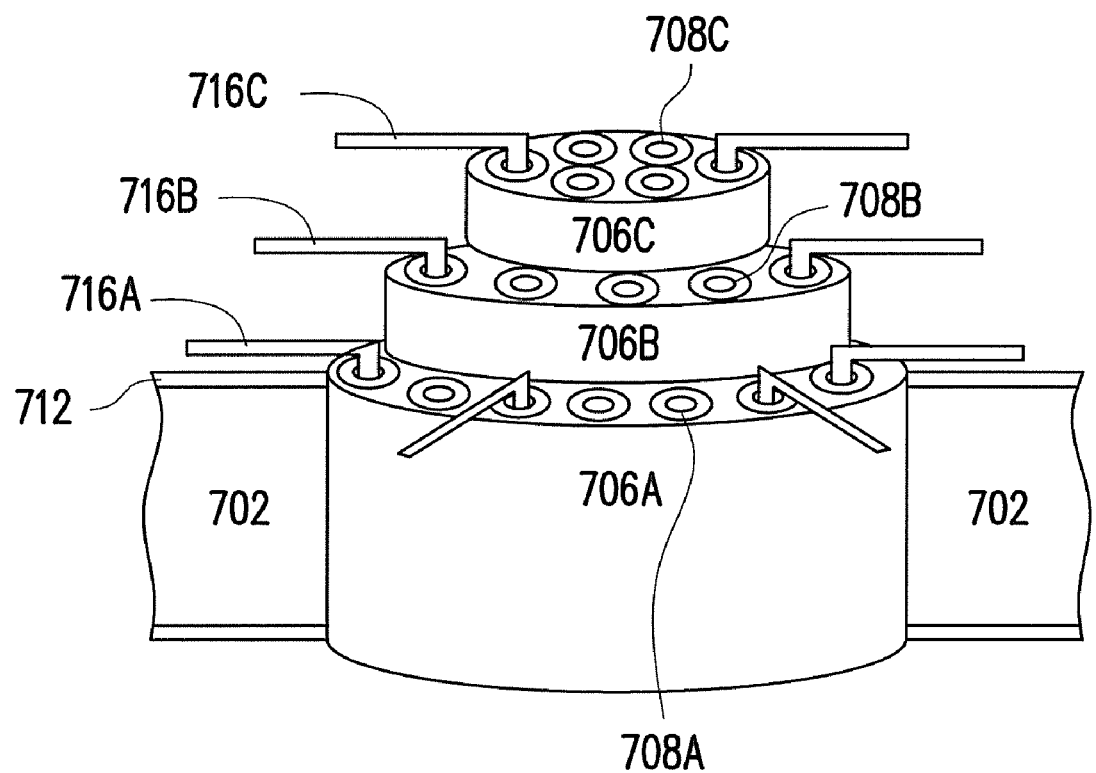
FIG. 7 is a schematic view of a structure of leads within a via in a substrate according to an exemplary embodiment.

FIG. 7 is a schematic view of a structure of leads within a via in a substrate according to an exemplary embodiment. Referring to FIG. 7, a multi-layer structure is manufactured in the present disclosure, and the structure is respectively connected to different conductive layers. A first surrounding conductor 706A, a second surrounding conductor 706B, and a third surrounding conductor 706C are all disposed in a first via of the present disclosure, and respectively have first leads 708A, second leads 708B, and third leads 708C, so as to be connected to a first conductive layer 716A, a second conductive layer 716B, and a third conductive layer 716C, respectively. The first to third conductive layers may be electrically coupled to other signals or potentials, respectively. Further, the first surrounding conductor 706A, the second surrounding conductor 706B, and the third surrounding conductor 706C are stacked together like cakes, among which the first surrounding conductor 706A has the largest radius, the third surrounding conductor 706C has the smallest radius, and the three surrounding conductors are all electrically coupled to the ground via a fourth conductive layer 712.

This exemplary embodiment discloses three signal conductive layers, one ground conductive layer, and three surrounding conductors, but the present invention is not limited hereby, and the number of the signal conductive layer, the ground conductive layer, and the surrounding conductor may be varied.

Figure 8:
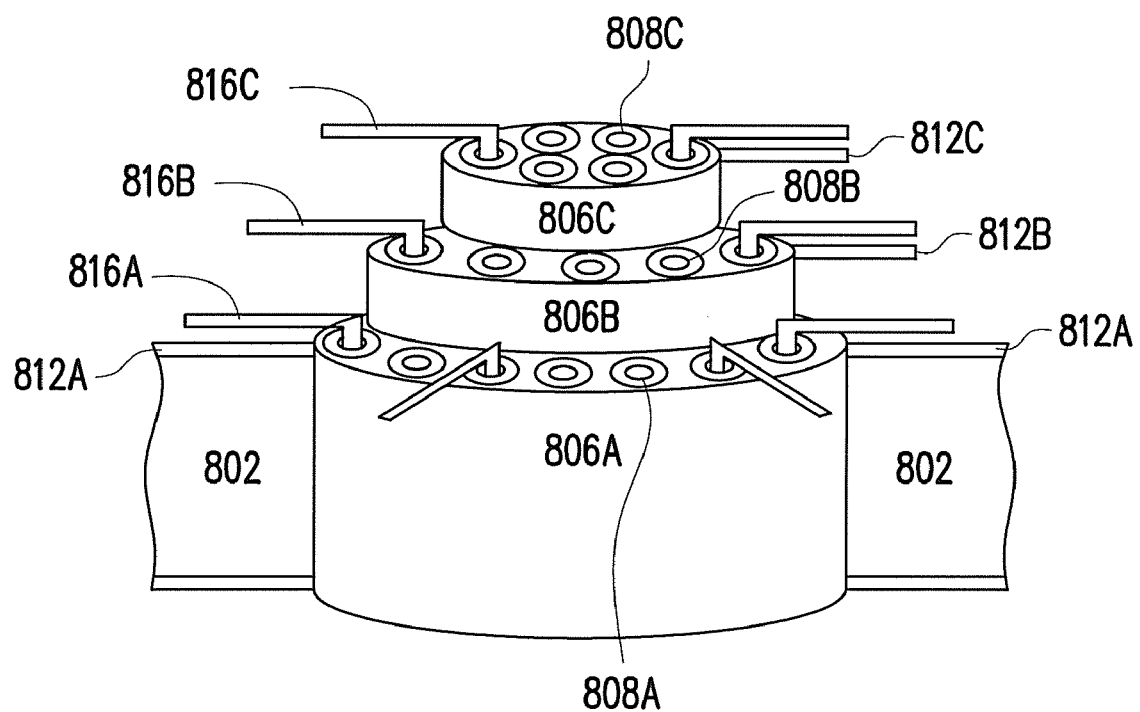
FIG. 8 is a schematic view of a structure of leads within a via in a substrate according to an exemplary embodiment.

FIG. 8 is a schematic view of a structure of leads within a via in a substrate according to an exemplary embodiment. Referring to FIG. 8, surrounding conductors of the present disclosure may be electrically connected to different ground conductive layers, respectively. A first surrounding conductor 806A, a second surrounding conductor 806B, and a third surrounding conductor 806C are all located within a first via of the present disclosure, and respectively have first leads 808A, second leads 808B, and third leads 808C, so as to be connected to a first conductive layer 816A, a second conductive layer 816B, and a third conductive layer 816C, respectively. The conductive layers 816A, 816B and 816C may be electrically coupled to other signals or potentials, respectively. Further, the first surrounding conductor 806A, the second surrounding conductor 806B, and the third surrounding conductor 806C are stacked together like cakes, among which the first surrounding conductor 806A has the largest radius, and the third surrounding conductor 806C has the smallest radius. The three surrounding conductors are electrically coupled to the ground via a fourth conductive layer 812A, a fifth conductive layer 812B, and a sixth conductive layer 812C, respectively. In this exemplary embodiment, the fourth conductive layer 812A, the first lead 808A, the fifth conductive layer 812B, the second lead 808B, the sixth conductive layer 812C, and the third lead 808C are stacked, so as to achieve more desirable electrical effects.

This exemplary embodiment discloses three signal conductive layers, three ground conductive layers, and three surrounding conductors, but the present invention is not limited hereby, and the number of the signal conductive layer, the ground conductive layer, and the surrounding conductor may be varied.

In the above exemplary embodiments, the via, the surrounding conductors, and the leads are all round in shape, but the present invention is not limited hereby, and the via, the surrounding conductors, and the leads may be square-shaped or in other shapes.

In addition, in the above exemplary embodiments, the conductive layers, the surrounding conductors, and the leads may be made of metals or other conductive materials.

The above exemplary embodiments provide a structure of leads within a via in a substrate to eliminate the problem of crosstalk. Therefore, the structure can be applied to a structure with a vertical interconnection between a circuit on a surface of the substrate and a circuit on the other surface of the substrate and a manufacturing process thereof, and may also be applied to a manufacturing process of an integrated circuit (IC) and a manufacturing process of a multi-layer circuit, such as a circuit board.

In the above exemplary embodiments, a plurality of coaxial leads is manufactured in a single via. The coaxial leads include leads for electrically connecting circuits located on different surfaces of the via. The surrounding conductors wrap the leads, and provide an electromagnetic shielding effect to eliminate the problem of crosstalk. In addition, the surrounding conductors may be grounded.

In the structure of leads within a via in a substrate according to the above embodiments, as the single via has a plurality of coaxial leads, the problem of impedance mismatch is avoided.

The structure of leads within a via in a substrate according to the above exemplary embodiments may be adapted to electrically connect a plurality of circuits on a surface of the substrate to a plurality of circuits on the other surface of the substrate, so as to increase the circuit density in a unit of area.

Moreover, the above exemplary embodiments provide a manufacturing method, which is adapted to manufacture the above structure of leads within a via in a substrate. In an exemplary embodiment, a plurality of patterned insulating material layers and conductive layers is further disposed on the surfaces of the first conductive layer and the second conductive layer to increase the circuit density, and the conductive layers on different surfaces of the substrate are electrically connected through the leads within the via.

It will be apparent to those skilled in the art that various modifications and variations can be made to the structure of the present disclosure without departing from the scope or spirit of the invention. In view of the foregoing, it is intended that the embodiments described be considered as exemplary only, with the true scope of the embodiments being indicated by the following claims and their equivalents.

What is claimed is:

1. Multi-coaxial leads within a single via in a circuit substrate, comprising:
    a substrate comprising at least one via;
    a first surrounding conductor, disposed in the via and comprising a plurality of first through holes;
    a second surrounding conductor, disposed above the first surrounding conductor and comprising a plurality of second through holes; and
    a plurality of coaxial leads, comprising a plurality of first coaxial leads and a plurality of second coaxial leads, wherein said plurality of said first coaxial leads formed in said first through holes, said plurality of said second coaxial leads formed in said second through holes.

2. The multi-coaxial leads within a single via in a circuit substrate as claimed in claim 1, further comprising:
    a first plurality of said coaxial leads, configured in an outmost annular arrangement as a first annular arrangement within said first through holes.

3. The multi-coaxial leads within a single via in a circuit substrate as claimed in claim 2, further comprising:
    a second plurality of said coaxial leads, configured in a second annular arrangement next to said first annular arrangement within said second through holes.

4. The multi-coaxial leads within a single via in a circuit substrate as claimed in claim 3, further comprising:
    a third surrounding conductor, disposed above the second surrounding conductor and comprising a plurality of third through holes;
    a third plurality of said coaxial leads, configured in a third annular arrangement next to said second annular arrangement within said third through holes.

5. The multi-coaxial leads within a single via in a circuit substrate as claimed in claim 1, wherein said first and second surrounding conductor electrically are coupling to power or ground.

6. The multi-coaxial leads within a single via in a circuit substrate as claimed in claim 1, wherein said plurality of coaxial leads are electrically coupling to a signal.

7. The multi-coaxial leads within a single via in a circuit substrate as claimed in claim 1, wherein said first plurality of coaxial lead and said second plurality of coaxial lead are electrically coupling to a same circuit layer.

8. The Multi-coaxial leads within a single via in a circuit substrate as claimed in claim 1, wherein said first plurality of coaxial lead and said second plurality of coaxial lead are electrically coupling to different circuit layers.

9. The Multi-coaxial leads within a single via in a circuit substrate as claimed in claim 1, wherein said first plurality of coaxial lead and said second plurality of coaxial lead are electrically coupling to a same bottom circuit layer.

10. The Multi-coaxial leads within a single via in a circuit substrate as claimed in claim 1, wherein said first plurality of coaxial lead and said second plurality of coaxial lead are electrically coupling to different bottom circuit layers.

11. The Multi-coaxial leads within a single via in a circuit substrate as claimed in claim 1, wherein said first surrounding conductor having a vertical length equivalent to that of said via.

12. The Multi-coaxial leads within a single via in a circuit substrate as claimed in claim 1, wherein said first surrounding conductor having a vertical length longer than that of said via.

13. The multi-coaxial leads within a single via in a circuit substrate as claimed in claim 1, wherein said first plurality of coaxial lead has a top end and a bottom end coplanar with that of said first surrounding conductor.

14. The multi-coaxial leads within a single via in a circuit substrate as claimed in claim 1, wherein said first plurality of coaxial lead has a top end and a bottom end extruded out of that of said first surrounding conductor.

15. The multi-coaxial leads within a single via in a circuit substrate as claimed in claim 8, further comprising a second ground metal in between neighboring circuit layers.

16. The multi-coaxial leads within a single via in a circuit substrate as claimed in claim 2, wherein said first surrounding conductor is electrically coupling to a first ground metal.

17. The multi-coaxial leads within a single via in a circuit substrate as claimed in claim 15, wherein said second surrounding conductor is electrically coupling to said second ground metal in between said neighboring circuit layers.

18. The multi-coaxial leads within a single via in a circuit substrate as claimed in claim 15, wherein said third surrounding conductor is electrically coupling to a third ground metal in between said neighboring circuit layers and a third circuit layer.

19. The multi-coaxial leads within a single via in a circuit substrate as claimed in claim 4, wherein said first coaxial leads connected to a first conductive layer, said second coaxial leads connected to a second conductive layer, and said third coaxial leads connected to a third conductive layer.

20. The multi-coaxial leads within a single via in a circuit substrate as claimed in claim 19, wherein the first coaxial leads comprising:

a plurality of first leads, disposed in the first through holes of the first surrounding conductor and surrounded by the first surrounding conductor;

a plurality of first insulating layers, each of first insulating layers respectively being disposed correspondingly between the first surrounding conductor and each of the first leads within the corresponding first through holes for electrically isolating the first lead from the first surrounding conductor;

the second coaxial leads comprising:

a plurality of second leads, disposed in the second through holes of the second surrounding conductor and surrounded by the second surrounding conductor;

a plurality of second insulating layers, each of second insulating layers respectively being disposed correspondingly between the second surrounding conductor and each of the second leads within the corresponding second through holes for electrically isolating the second lead from the second surrounding conductor; and the third coaxial leads comprising:

a plurality of third leads, disposed in the third through holes of the third surrounding conductor and surrounded by the third surrounding conductor;

a plurality of third insulating layers, each of third insulating layers respectively being disposed correspondingly between the third surrounding conductor and each of the third leads within the corresponding third through holes for electrically isolating the third lead from the third surrounding conductor.

21. The multi-coaxial leads within a single via in a circuit substrate as claimed in claim 4, wherein said first surrounding conductor connected to a fourth conductive layer, said second surrounding conductor connected to a fifth conductive layer, and said third surrounding conductor connected to a sixth conductive layer.

* * * * *